United States Patent [19]

Dunn

[11] Patent Number: 5,710,545
[45] Date of Patent: Jan. 20, 1998

[54] DISPLAY PROVIDING REVERSIBLE CONTRASTING INDICIA

[75] Inventor: Dustin E. Dunn, Coral Springs, Fla.

[73] Assignee: Motorola, Inc., Schaumburg, Ill.

[21] Appl. No.: 541,998

[22] Filed: Oct. 10, 1995

[51] Int. Cl.$^6$ .............................. H04B 1/38; H03J 1/02; H03J 1/04

[52] U.S. Cl. .................. 340/825.36; 340/815.45; 340/815.78; 340/815.42; 340/825.44; 348/712; 348/713; 455/158.1; 116/250.1; 116/256.7; 116/298; 116/318; 362/23; 362/24; 362/27; 362/29

[58] Field of Search .............. 340/825.64, 815.45, 340/815.55, 815.78, 815.42; 455/351, 154.1, 384, 90, 349, 157.2, 158.2, 159.1; 348/712, 713; 116/250.1, 256.7, 286.8, 298, 318; 362/23, 24, 27, 29

[56] References Cited

U.S. PATENT DOCUMENTS

| | | | |
|---|---|---|---|
| 2,738,758 | 3/1956 | Cutler et al. | 116/124.4 |
| 3,750,619 | 8/1973 | Yamamura | 116/124.1 |
| 3,857,361 | 12/1974 | Gibson et al. | 116/124.4 |
| 5,159,706 | 10/1992 | Hodsdon | 455/90 |

OTHER PUBLICATIONS

Brochure, MTS 2000™ Model I Flashport™ Portable Radios Operating Instructions—Basic Radio Operation, 68P81O72C15–C, Motorola, Inc., Radio Products Group, 8000 West Sunrise Boulevard, Ft. Lauderdale, Florida 33322, pp. 16 and 17, 1992, 1993, 1995, no month.

Service Manual, Saber Series "Securenet, Handie-Talkie" Portable Radios 403–512 MHZ, Service Manual 68P81045C75–O, p. 4, 1988 Motorola, Inc., Portable Products Division, 8000 W. Sunrise Blvd, Ft. Lauderdale, Florida 33322 Feb. 1988, no month.

*Primary Examiner*—Michael Horabik
*Assistant Examiner*—Yonel Beaulieu
*Attorney, Agent, or Firm*—Barbara R. Doutre

[57] ABSTRACT

A display (100) provides reversible contrasting indicia (112, 114) in order to accommodate an increased number of easily distinguishable indicia on the display. The display provides a first contrast mode (200) in which one set of indicia (112) become visually more prominent than another set (114) and a second contrast mode (300) in which the contrast of the first contrast mode is reversed. Selecting between the first and second contrast modes (200, 300) is controlled by backlighting of the display (100).

29 Claims, 4 Drawing Sheets

DISPLAY PROVIDING REVERSIBLE CONTRASTING INDICIA

TECHNICAL FIELD

This invention relates in general to displays and dials and more specifically to displays and dials used in mode selectors of communication devices.

BACKGROUND

With the continuing advancements made in technology, more user controlled features are being added to today's communication products. Consumers are continually requesting smaller, compact products which encompass these additional user controlled features. As communication products become smaller, it becomes a challenge to display all of the available user controlled features in a manner which allows the user to easily access and distinguish between them. For example, many two-way portable radios accommodate sixteen frequency channels that require sixteen separate channel positions distributed around a channel frequency selector control. The channel frequency selector control typically consists of a knob which can be rotated about a dial that displays all of the available channel numbers. The display of indicia, such as alphanumeric characters or symbols, about the control knob becomes constrained by the space limitations of smaller radios. Positioning of all the channel numbers about the knob can result in overcrowding of the numerals which can make it confusing for the radio operator to distinguish exactly which channel he/she is operating on. Also, quality issues can arise in the manufacturing of channel selector assemblies, as it is difficult to maintain alignment tolerances between the knob position and the actual channel being indicated when many channel numbers are being displayed.

One of the current solutions to the overcrowding and tolerance problems associated with today's channel selector assemblies is to provide a dial which displays odd numbered channels separated by a dot. This technique allows the dial to appear less crowded and helps minimize alignment problems. However, the operator of the radio still has the disadvantage of not having a display indicating all of the available channels. It would be an advantage for the operator of a two-way radio to have all of the available channels displayed and yet still be able to easily distinguish between them.

Accordingly, there is a need for an improved display which allows all available channels to be displayed with improved differentiation between the indicia.

DETAILED DESCRIPTION OF THE PREFERRED EMBODIMENT

Figure 1:
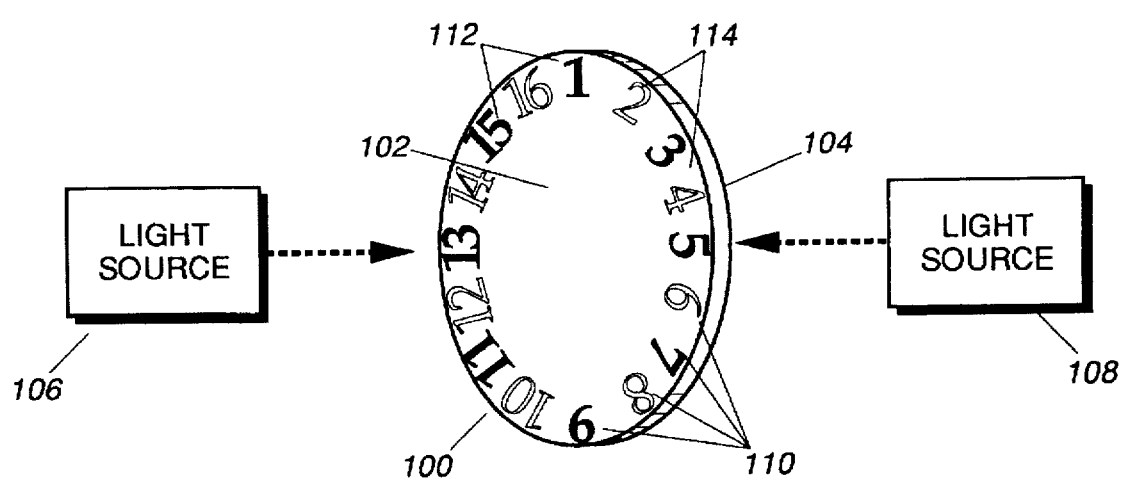
FIG. 1 is a display in accordance with the present invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1 of the accompanying drawings, there is shown a display 100 in accordance with the present invention. The display 100 is preferably, but not limited to, being used as a channel indicator dial for a communication device to be shown later. The display 100 is formed from a substrate, preferably an escutcheon, and includes first and second surfaces 102, 104 for receiving light from first and second light sources 106, 108 respectively. The display 100 is preferably viewed from the first surface 102, and thus the first surface 102 will also be referred to as a viewing surface, a top surface, or an upper surface, while the second surface 104 will also be referred to as a back surface, a bottom surface, or a lower surface. Display 100 includes a series of indicia 110 which provide reversible contrasting indicia to the viewing surface 102 in accordance with the present invention. The series of indicia 110 preferably comprise sequentially arranged numerals arranged about the perimeter of the display 100, however one skilled in the art realizes that other indicia, such as alphanumeric or symbol characters, could also be used. In accordance with the present invention, the reversible contrasting indicia are provided by first and second sets of indicia 112, 114, wherein the first set of indicia 112 preferentially reflect light, and the second set of indicia 114 preferentially transmit light. The series of indicia 110 are preferably arranged such that the first set of indicia 112, which preferentially reflect light from the viewing surface 102, are alternately dispersed between the second set of indicia 114, which preferentially transmit light through the viewing surface 102. In the preferred embodiment of the invention, the odd numerals form the first set of indicia 112 which preferentially reflect light, while the even numerals form the second set of indicia 114 which preferentially transmit light.

The first set of indicia 112 which preferentially reflect light are preferably formed of substantially reflective colored indicia within display 100. The second set of indicia 114 which preferentially transmit light are preferably formed of substantially clear indicia formed within display 100. The substantially clear and substantially reflective indicia provide dissimilar light propagation properties with which to achieve reversible contrasting indicia.

When light, such as ambient light, is dispersed from the first light source 106 upon the first (or viewing) surface 102, the light is substantially reflected off of the odd numerals while it passes through the substantially clear numerals. Thus, a first contrast mode is achieved whereby the first set of indicia become more visually prominent than the second set of indicia.

When light, preferably from light emitting diodes (LEDs), is transmitted from the second light source 108 and dispersed upon the back surface 104 of display 100, the contrast between the first and second sets of indicia 112, 114 is reversed to achieve a second contrast mode. This second contrast mode is achieved regardless of whether light is dispersed on the front surface 102. The light from the second light source 108 is transmitted through the substantially clear indicia in stronger contrast to any light being reflected from the preferentially reflective indicia. Thus, by backlighting the display 100, a second contrast mode is achieved whereby the second set of indicia become more visually prominent than the first set of indicia. In this second contrast mode, while all the numerals are still visible, the even numerals become more visually prominent than the odd numerals.

Figure 2:
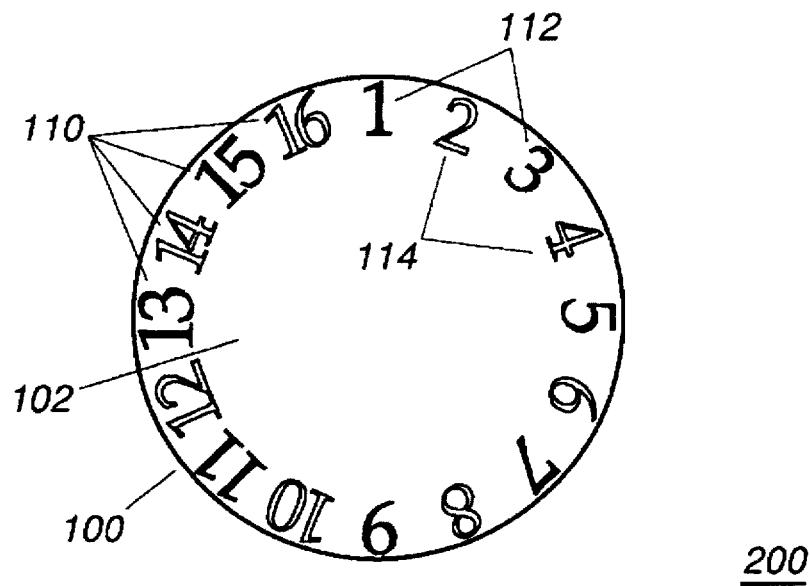
FIG. 2 is the display of FIG. 1 in a first contrast mode in accordance with the present invention.
Figure 3:
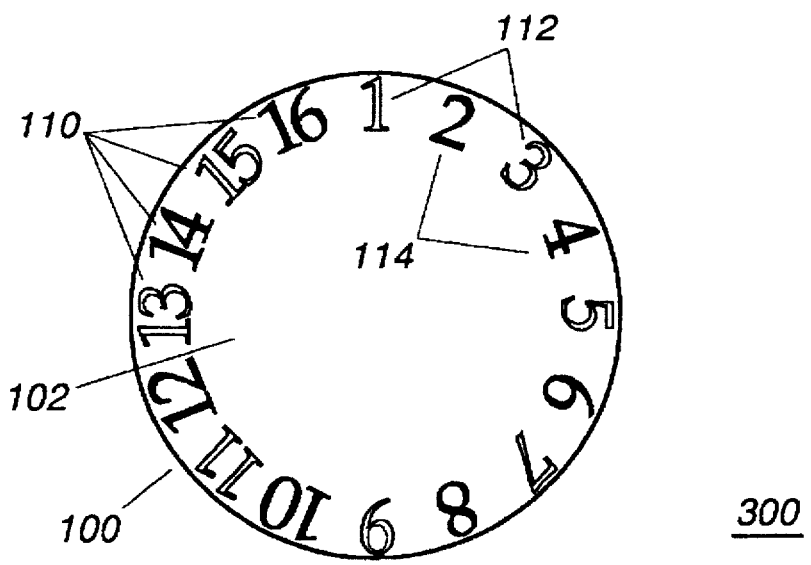
FIG. 3 is the display of FIG. 1 in a second contrast mode in accordance with the present invention.

Referring now to FIGS. 2 and 3, there is shown the display of FIG. 1 illustrated in its first and second contrast modes 200, 300 respectively. The first contrast mode 200 shown in FIG. 2 illustrates how the odd numerals become more visually prominent than the even numerals when light, such as ambient light, is received by the first surface 102 of the display 100. In this first contrast mode, only the first light source is applied to the first surface 102 of the display 100. Most of the light passes through the substantially clear indicia while being reflected off the substantially reflective indicia. Hence, for the first contrast mode 200, the odd numerals, which preferentially reflect the light, provide a strong contrast against the even numerals, which pass the light. By alternating the series of indicia between indicia that preferentially reflect light and indicia that preferentially transmit light, an alternating contrasting effect between the indicia can be achieved.

The second contrast mode 300 shown in FIG. 3 illustrates how the even numerals of display 100 become more visually prominent than the odd numerals. In this contrast mode the first and second light sources 106, 108 disperse light upon their respective surfaces 102, 104, preferably ambient light to the first surface 102 and LEDs to the second surface 104. The contrast between the odd and even numerals is now the reverse of that which was seen in the first contrast mode 200. In this second contrast mode 300, the light is transmitted through the substantially clear indicia to create the brighter even numerals in stronger contrast to that of the odd numerals. Hence, by providing dissimilar light propagation properties to the series of indicia 110 a display having reversible contrasting indicia is achieved.

Hence, the display 100 as described by the invention uses first and second sets of indicia 112, 114, one set being able to preferentially transmit light while the other set preferentially reflects light in order to provide reversible contrasting indicia. The reversible contrasting indicia allow for all the series of indicia 110 to be displayed with one set being more visually prominent than the other in one contrast mode, and the reverse contrast of the indicia occurring in another contrast mode.

The display 100 can be manufactured using any one of a number of available techniques known in the art, such as screen printing. For example, sequential indicia can be masked out on a printing screen. Using the screen, a clear polycarbonate escutcheon can be printed with a substantially opaque ink or paint material leaving all the indicia clear. A second printing screen can be made and used to apply reflective translucent ink or paint over one group of indicia while the other group of indicia remains substantially clear. The substantially clear indicia will thus preferentially transmit light while the reflective group of indicia will preferentially reflect light. By providing indicia with different light propagation properties, the reversible contrasting indicia are formed. The reversible contrasting indicia can thus provide for a sequence of predetermined adjacent characters or symbols which can be arranged with alternating contrast of adjacent characters. An increased number of indicia can thus be displayed side by side over a small surface area of a display while maintaining differentiation between the indicia in either contrast mode.

Figure 4:
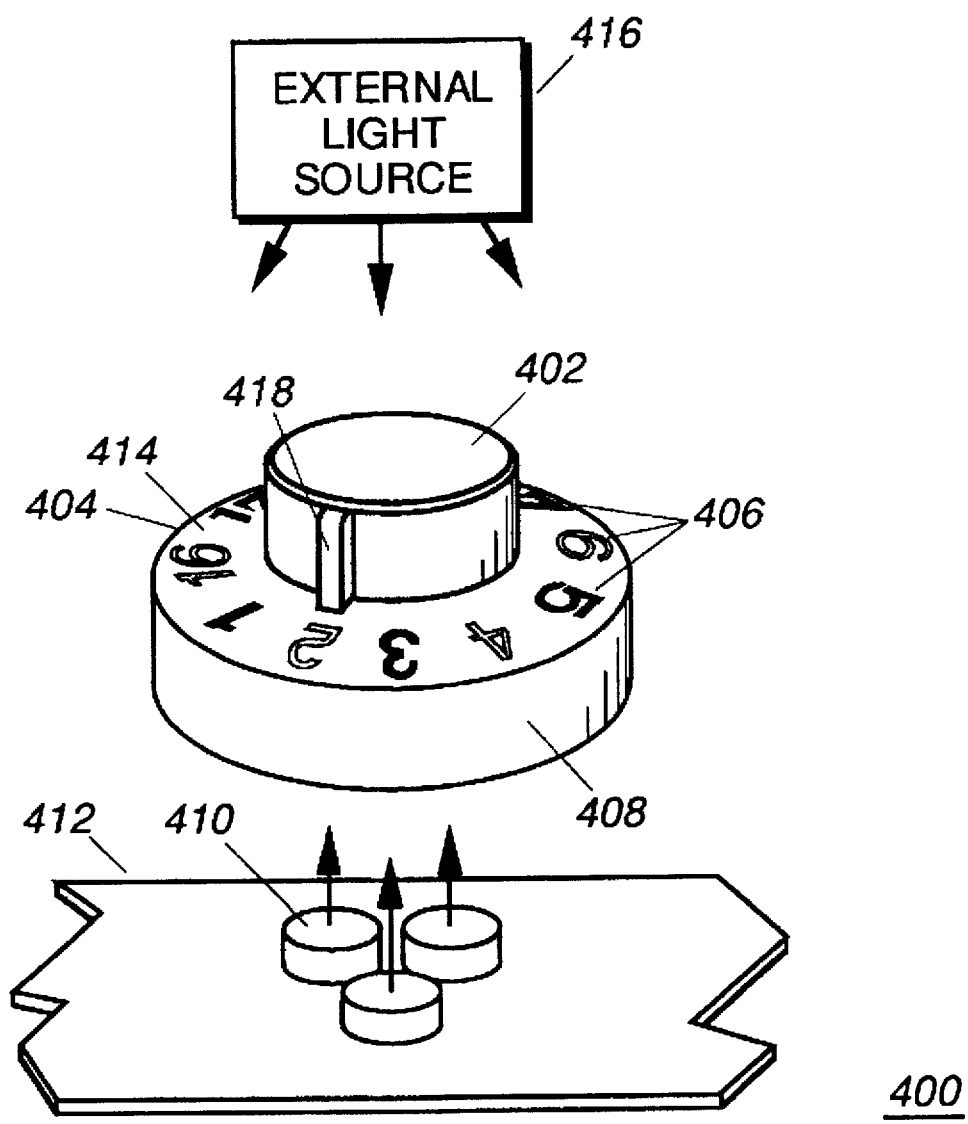
FIG. 4 is a channel selector assembly including a dial in accordance with the present invention.

Referring now to FIG. 4, there is shown a channel selector assembly 400 in accordance with the present invention. The channel selector assembly 400 includes knob 402 which can be rotated about a channel indicator dial 404 made in accordance with the present invention. Knob 402 includes an indicator, or pointer, 418 which aligns with the selected channel on dial 404. Dial 404 provides a display generating a series of reversible contrasting indicia 406 in accordance with the present invention. The series of reversible contrasting indicia 406 preferably alternate between preferentially reflecting light and preferentially transmitting light in order to provide first and second contrast modes in accordance with the present invention. Dial 404 is preferably disposed upon a hollow base 408 beneath which a selectable internal light source 410, here a plurality of LEDs, can transmit light. The LEDs 410 are preferably included on a portion of an electronic circuit board 412 and receive power from a power source (not shown). A top surface 414 of dial 404 receives external light, such as ambient light, from external light source 416.

When the external light source 416 is shone upon the top surface 414 of dial 404, those indicia which preferentially reflect light become more visually prominent that those indicia which preferentially transmit light. When the internal light source 410 is additionally shone through a bottom surface of the dial, those indicia which preferentially transmit light become more visually prominent that those indicia which preferentially reflect light. Hence, first and second contrast modes have been provided to the channel selector assembly 400. All of the channels can thus be indicated on the dial 404 and still be easily differentiated so that alignment by indicator 418 occurs with greater reliability.

Figure 5:
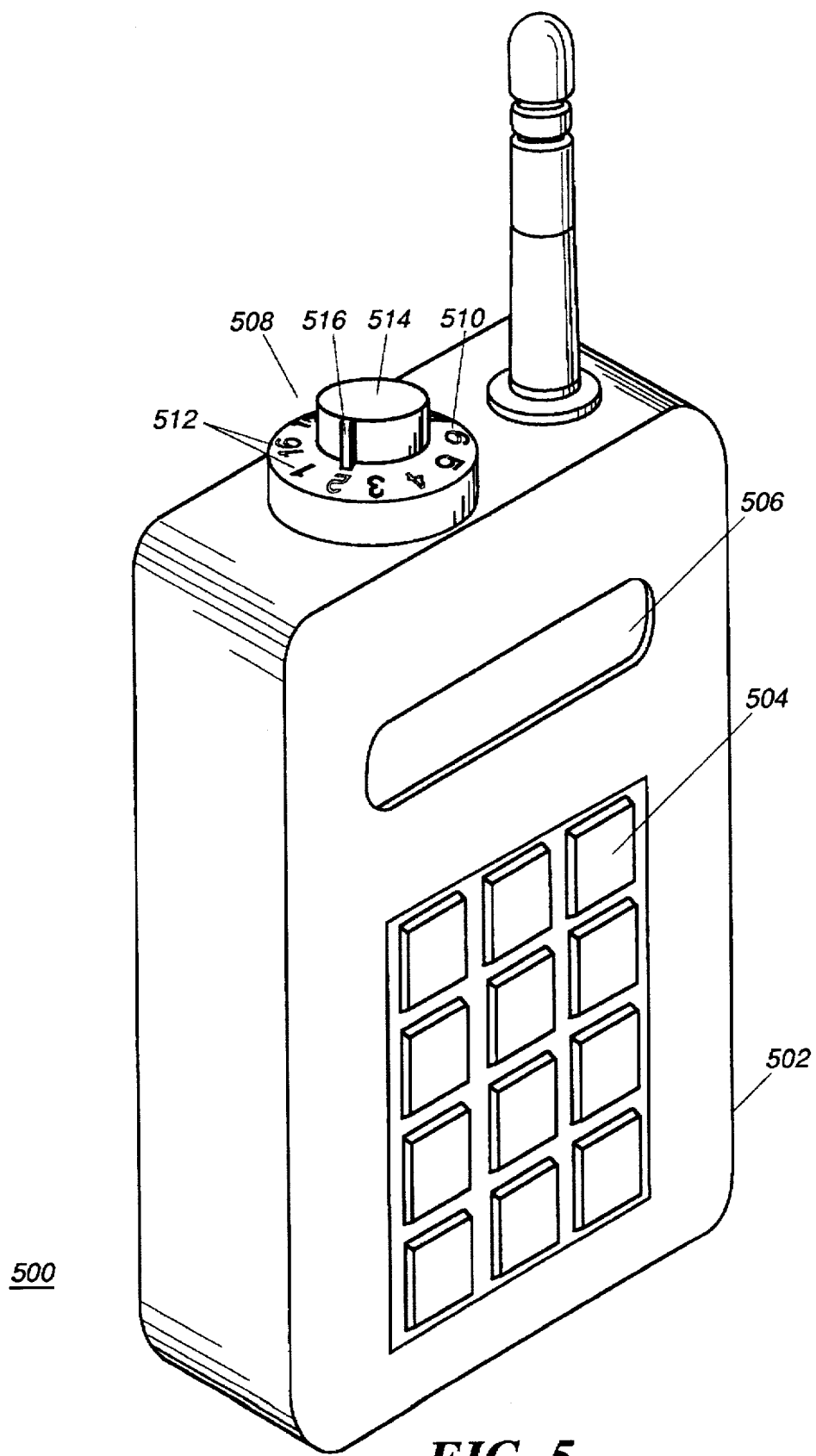
FIG. 5 is a two-way radio in accordance with the present invention.

Referring now to FIG. 5, there is shown a communication device, such as a two-way radio 500, in accordance with the present invention. Radio 500 includes housing 502 and preferably includes a keypad 504 and a liquid crystal display (LCD) 506. A channel frequency selector 508 incorporating a dial 510 formed in accordance with the present invention is disposed on the housing 502. In accordance with the invention, dial 510 includes reversible contrasting indicia 512. The channel frequency selector 508 preferably includes a knob 514 which can be rotated to align an alignment indicator 516 with each individual indicia. The reversible contrasting indicia 512 are responsive to an external light source and an internal light source (not shown). The internal light source, preferably LEDs, is included within the housing 502 and is capable of being selected and de-selected, preferably by the same controls which control any backlighting of the keypad 504 or alternatively by a separate power switch. During a first contrast mode, the radio is exposed to external light, and the dial 510 displays all of the frequency channels with one set of frequency channels being displayed more prominently than the other. When the internal LEDs are switched on, a second contrast mode occurs whereby all the frequency channels remain visible but the contrast between adjacent channels is reversed. By backlighting the dial 510, the radio operator is provided with the advantage of a second contrast mode with which to display an entire sequence of frequency channels and yet still distinguish between adjacent channels. This is a particular advantage when the external light source is low or non-existent.

By employing a display having reversible contrasting indicia as described by the invention, an increased number of alphanumeric characters can be accommodated with distinct contrast between the characters. When the display is implemented as a dial for a channel indicator assembly, the overcrowding effects associated with prior art channel indicators are overcome. When the channel indicator as described by the invention is implemented on a small communication device, the channels remain easily differentiated and misalignments by the operator are less likely to occur.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A display having upper and lower surfaces for receiving both internal and external light sources, comprising:
   indicia disposed on the display;
   the indicia providing a first contrast mode when the upper surface of the display is submitted to the external light source;
   the indicia providing a second contrast mode when the lower surface of the display is submitted to the internal light source; and
   all the indicia being visible in either of the first or second contrast modes.

2. A display as described in claim 1, wherein the external light source comprise ambient light.

3. A display as described in claim 1, wherein the internal light source comprises LEDs located below the lower surface of the display.

4. A display as described in claim 1, wherein the indicia, during the first contrast mode, preferentially reflect light, and during the second contrast mode, preferentially transmit light.

5. A display as described in claim 1, wherein the indicia, during the first contrast mode, generate alternately contrasted indicia, and the indicia, during the second contrast mode, reverse the contrast of the alternately contrasted indicia.

6. A display having reversible contrasting indicia responsive to an external light source in a first mode of operation and an internal light source in a second mode of operation, comprising:
   a substrate having a substantially opaque background including a series of indicia disposed about the substrate, said series of indicia providing a first contrasting effect in response to the external light source and a second contrasting effect in response to the internal light source; and
   all of the series of indicia being visible with each of the first or second contrasting effects.

7. A display as described in claim 6, wherein the series of indicia comprise a first group of indicia which preferentially reflect light during the first contrasting effect and a second group of indicia which preferentially transmit light during the second contrasting effect.

8. A substrate having a first surface for receiving a first light source and a second surface for receiving a second light source, comprising:
   first and second sets of indicia disposed about the substrate and responsive to the first light source for providing a contrast between the first and second sets of indicia; and
   said first and second sets of indicia responsive to the second light source for reversing the contrast between the first and second sets of indicia; and
   all of the first and second sets of indicia being displayed at the same time while maintaining differentiation between the first and second sets of indicia.

9. A substrate as described in claim 8, wherein the first set of indicia preferentially reflect light and the second set of indicia preferentially transmit light.

10. A substrate as described in claim 8, wherein the substrate comprises a substantially opaque polycarbonate escutcheon.

11. A substrate as described in claim 8, wherein the first set of indicia comprise colored indicia formed within the substrate and the second set of indicia comprise substantially clear indicia formed within the substrate, the colored indicia become more visually prominent than the substantially clear indicia in response to the first light source, and the clear indicia become more visually prominent than the colored indicia in response to the second light source.

12. A substrate as described in claim 8, wherein the first and second sets of indicia comprise a series of sequentially arranged numerals, the first set of indicia comprising odd numerals and the second set of indicia comprising even numerals.

13. A substrate as described in claim 8, wherein the first and second sets of indicia comprise a sequence of predetermined adjacent characters arranged with alternating contrast of adjacent characters.

14. A substrate as described in claim 8, wherein the first light source comprises ambient light and the second light source comprises LEDs.

15. A substrate as described in claim 8, wherein the first light source comprises ultraviolet light and the second light source comprises LEDs.

16. A channel selector providing for the simultaneous viewing of all channels indicia for a communication device, including:
   an escutcheon having an upper surface for receiving an external light source and a lower surface for receiving an internal light source; and
   reversible contrasting indicia disposed about the escutcheon, said reversible contrasting indicia responsive to the internal light source for generating a first contrast mode and responsive to the external light source for generating a second contrast mode, said second contrast mode providing a reverse contrast to the first contrast mode.

17. A channel selector as described in claim 16, wherein the reversible contrasting indicia a first group of indicia which preferentially transmit light and a second group of indicia which preferentially reflect light.

18. A channel selector as described in claim 16, wherein the internal light source comprises LEDs located below the lower surface of the escutcheon.

19. A channel selector as described in claim 16, wherein the external light source comprises ambient light.

20. A display providing simultaneous viewing Of all channel indicia, comprising:
   an escutcheon having a first surface for receiving light transmitted from a first light source and a second surface for receiving light transmitted from a second light source; and
   first and second sets of indicia disposed on the escutcheon, the first set of indicia preferentially reflect light received from the first light source, and the second set of indicia preferentially transmit light received from the second light source, when light is received from the first light source, the first set of indicia become more visually prominent than the second set of indicia, and when light is received from the second light source, the second set of indicia become more visually prominent than the first set of indicia.

21. A two-way radio, comprising:
   a housing;
   a channel indicator dial disposed on the housing;
   a light source, capable of being selected and de-selected, located within the housing and beneath the channel indicator dial for transmitting light through the channel indicator dial when selected; and reversible contrast indicia disposed within the channel indicator dial, said reversible contrast indicia providing a first contrast mode in response to said light source being selected and a reversed contrast mode in response to said light source being de-selected, the reversible contrast indicia providing for the simultaneous display of all indicia in both the first and second contrast modes.

22. A two-way radio as described in claim 21, wherein the reversible contrast indicia comprise sequentially arranged odd and even numerals, the first contrast mode displaying the odd numerals more visually prominently than the even numerals, and the reversed contrast mode displaying the even numerals more visually prominently than the odd numerals.

23. A two-way radio as described in claim 21, wherein the reversible contrast indicia comprise a first group of indicia that preferentially transmit light and a second group of indicia that preferentially reflect light.

24. A communication device, including:

a dial;

a plurality of alternately contrasted indicia disposed side by side about the dial; and a light source for transmitting light through the dial, said plurality of alternately contrasted indicia reversing in contrast in response to the light being transmitted through the dial.

25. A communication device as described in claim 24, wherein the dial comprises a substantially opaque escutcheon and the alternately contrasted indicia comprise a first group of indicia which preferentially transmit light and a second group of indicia which preferentially reflect light.

26. A communication device as described in claim 24, wherein the first group of indicia comprise substantially clear indicia and the second group of indicia comprise reflective colored indicia formed within the substantially opaque escutcheon.

27. A communication device as described in claim 24, wherein the alternately contrasted indicia comprise a series of sequential numbers, the substantially clear indicia comprising even numbers and the reflective colored indicia comprising odd numbers.

28. A communication device as described in claim 24, wherein the alternately contrasted indicia comprise a series of sequential numerals, the substantially clear indicia comprising odd numerals and the reflective colored indicia comprising even numerals.

29. A communication device as described in claim 24, wherein the communication device comprises a radio and the dial operates as a channel indicator dial for the radio.

* * * * *